(12) United States Patent
Higashihara et al.

(10) Patent No.: US 9,065,012 B2
(45) Date of Patent: Jun. 23, 2015

(54) COMPOSITE SUBSTRATES AND FUNCTIONAL DEVICES

(71) Applicant: NGK INSULATORS, LTD., Aichi-prefecture (JP)

(72) Inventors: Shuuhei Higashihara, Nagoya (JP); Makoto Iwai, Kasugai (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

(21) Appl. No.: 14/288,666

(22) Filed: May 28, 2014

(65) Prior Publication Data

US 2014/0264429 A1    Sep. 18, 2014

Related U.S. Application Data

(63) Continuation of application No. PCT/JP2013/071579, filed on Aug. 2, 2013.

(30) Foreign Application Priority Data

Aug. 6, 2012  (JP) ................................. 2012-173667

(51) Int. Cl.
*H01L 33/00* (2010.01)
*H01L 33/24* (2010.01)
*C30B 19/12* (2006.01)
*C30B 19/02* (2006.01)
*C30B 29/40* (2006.01)

(52) U.S. Cl.
CPC ............... *H01L 33/24* (2013.01); *C30B 19/12* (2013.01); *C30B 19/02* (2013.01); *C30B 29/406* (2013.01); *H01L 2933/0083* (2013.01)

(58) Field of Classification Search
CPC .................. H01L 21/02458; H01L 21/02488; H01L 29/20; H01L 29/365; H01L 29/778; H01L 29/0649; H01L 33/00; H01L 33/007; H01L 33/32; H01L 33/40
USPC ................................ 257/86, 103, E33.054, 77
See application file for complete search history.

(56) References Cited

U.S. PATENT DOCUMENTS

| 6,860,943 | B2  | 3/2005  | Koike et al. | |
|-----------|-----|---------|--------------|-------|
| 7,294,200 | B2* | 11/2007 | Fujikura et al. | 117/86 |
| 7,470,938 | B2* | 12/2008 | Lee et al. | 257/103 |

(Continued)

FOREIGN PATENT DOCUMENTS

| JP | 2003-124128 A | 4/2003 |
|----|---------------|--------|
| JP | 2005-281067 A | 10/2005 |

(Continued)

OTHER PUBLICATIONS

International Search Report for PCT Patent App. No. PCT/JP2013/071579 (Sep. 10, 2013).

(Continued)

*Primary Examiner* — Michael Lebentritt
(74) *Attorney, Agent, or Firm* — Cermak Nakajima & McGowan LLP; Tomoko Nakajima

(57) ABSTRACT

Protrusions 2 each having a shape of a pyramid or a truncated pyramid are regularly arranged on a growing face 1a of a seed crystal 1 composed of gallium nitride single crystal. It is formed a gallium nitride crystal layer 4 having a thickness of 100 μm or smaller by flux method directly on the growing face 1a of the seed crystal.

11 Claims, 7 Drawing Sheets

(56) References Cited

U.S. PATENT DOCUMENTS

| | | | |
|---|---|---|---|
| 7,491,645 B2* | 2/2009 | Chen | 438/681 |
| 7,754,504 B2* | 7/2010 | Ohmae et al. | 438/22 |
| 8,044,422 B2* | 10/2011 | Dai et al. | 257/98 |
| 8,198,177 B2* | 6/2012 | Nakahata et al. | 438/471 |
| 8,349,711 B2* | 1/2013 | Preble et al. | 438/478 |
| 8,795,431 B2* | 8/2014 | Imai et al. | 117/84 |
| 8,802,471 B1* | 8/2014 | Cich et al. | 438/46 |
| 2005/0092234 A1* | 5/2005 | Motoki et al. | 117/91 |
| 2005/0164419 A1* | 7/2005 | Hirota et al. | 438/46 |
| 2007/0037306 A1* | 2/2007 | Chen | 438/22 |
| 2009/0289261 A1* | 11/2009 | Sato et al. | 257/76 |
| 2010/0102353 A1* | 4/2010 | Park | 257/98 |
| 2011/0233623 A1* | 9/2011 | Park et al. | 257/288 |
| 2012/0111264 A1 | 5/2012 | Shimodaira et al. | |
| 2014/0026809 A1* | 1/2014 | Iwai et al. | 117/78 |
| 2014/0054605 A1* | 2/2014 | Iwai et al. | 257/76 |
| 2014/0138702 A1* | 5/2014 | Choi et al. | 257/76 |

FOREIGN PATENT DOCUMENTS

| | | |
|---|---|---|
| JP | 2010-163288 A | 7/2010 |
| JP | 2010-222187 A | 10/2010 |
| JP | 2011-037704 A | 2/2011 |
| JP | 2011-105586 A | 6/2011 |
| WO | WO2011/004904 A1 | 1/2011 |

OTHER PUBLICATIONS

Written Opinion for PCT Patent App. No. PCT/JP2013/071579 (Sep. 10, 2013).

* cited by examiner

COMPOSITE SUBSTRATES AND FUNCTIONAL DEVICES

This application is a continuation of, and claims priority under 35 U.S.C. §120 to, PCT Patent Application No. PCT/JP2013/071579, filed on Aug. 2, 2013, which claims priority under 35 U.S.C. §119 to Japanese Patent Application No. 2012-173667, filed Aug. 6, 2012, both of which are incorporated by reference.

FIELD OF THE INVENTION

The present invention relates to a composite substrate including a gallium nitride crystal layer and a functional device utilizing the same.

RELATED ART STATEMENT

Gallium nitride crystal takes attention as a material for excellent blue light emitting devices, has been commercialized in light emitting diodes, and is further expected for a semiconductor laser device of emitting blue-violet laser used for an optical pick up.

According to prior vapor phase epitaxy process, it is difficult to bent the dislocations accompanied with crystal growth, so that it becomes difficult to attain low dislocation density, different from the cases of the growth on the surface of a seed crystal applying ELO or a PSS sapphire. However, according to Na flux method, although dislocations present in a seed crystal substrate is extended into the grown crystal formed thereon, edge dislocations are bent in the grown crystal during the crystal growth and the bent dislocations are integrated in the crystal to reduce the dislocation density. It is thus possible to improve the quality of the grown crystal than the underlying seed crystal substrate without forced reduction of the dislocation density.

It is recently drawn attention a method of growing a gallium nitride crystal layer by Na flux method, as a breakthrough technique having high productivity compared with a vapor phase epitaxy process.

According to Patent document 1 (Japanese Patent Publication No. 2003-124128A), a surface of a GaN seed crystal film is etched to generate pits and gallium nitride crystal is then re-grown to fill the pits by vapor phase epitaxy process.

According to Patent document 2 (Japanese Patent Publication No. 2005-281067A), the whole surface of a GaN seed crystal film is processed by mechanical processing (scratching), dry etching and wet etching to introduce random roughness to the surface, and a gallium nitride crystal layer is then grown on the surface by flux method.

According to Patent document 3 (Japanese Patent Publication No. 2010-163288A), stripe-shaped recesses are formed on a surface of s sapphire body to leave protrusions between the recesses. Then, seed crystal films of GaN are formed on upper faces of the protrusions, respectively, and polycrystalline films are formed on wall faces facing the recesses. A thick film of gallium nitride crystal layer is grown thereon by Na flux method and the thus obtained gallium nitride layer is peeled off from the sapphire body.

According to Patent document 4 (Japanese Patent Publication No. 2011-105586A), micro steps are provided on a seed crystal film so as to reduce defects in a gallium nitride crystal layer grown by flux method by means of the micro steps.

According to Patent document 5 (WO 2011-004904 A1), many strip-shaped seed crystal films of GaN are arranged on a sapphire body to expose a surface of the sapphire body between the adjacent seed crystal films. Then, a gallium nitride crystal layer grown by flux method is spontaneously peeled off form the sapphire body to prevent cracks.

SUMMARY OF THE INVENTION

Recently, it is strongly demanded to improve energy efficiency of a semiconductor light emitting device. In the case that gallium nitride crystal is used for, for example, a light emitting device, it is decisively important to reduce the dislocation density as well as to reduce the in-plane distribution of the dislocation density for improving the energy efficiency during the light emission.

The inventors have studied to epitaxially grow a gallium nitride layer on a gallium nitride seed crystal by flux method. Particularly, it has been studied to produce a composite substrate of the gallium nitride crystal layer and supporting body.

However, in the case that the gallium nitride crystal is grown on a flat seed crystal of gallium nitride by flux method, nucleation points are randomly distributed and in-plane distribution of dislocation density tends to be deviated, so that it is difficult to produce a substrate of high quality over the whole surface.

Then, the inventors had studied various kinds of prior arts and found that it is difficult to reduce the dislocation density of a gallium nitride crystal layer grown by flux method and to reduce the in-plane distribution of the dislocation density at the same time, so that further improvement is required. Further, in the case that it is applied the technique of peeling the thus obtained gallium nitride crystal layer from the sapphire body, it is necessary to assure a sufficient thickness of the growth for the self-standing of the layer without the supporting body, leaving the problem of the productivity.

An object of the present invention is, in a composite substrate including a gallium nitride seed crystal and a gallium nitride crystal layer formed on the seed crystal by flux method, to reduce the dislocation density of the gallium nitride crystal layer and to reduce the in-plane distribution of the dislocation density.

The present invention provides a composite substrate comprising:

a seed crystal comprising a gallium nitride single crystal and a growing face, the seed crystal comprising protrusions regularly arranged on the growing face and each having a shape of a pyramid or a truncated pyramid; and a gallium nitride crystal layer directly formed on the growing face of the seed crystal by flux method and having a thickness of 100 μm or smaller.

The present inventors have reached the idea of thinning a thickness of a gallium nitride crystal layer formed by flux method on a seed crystal film to 100 μm or smaller to prevent the peeling of the gallium nitride crystal layer from a supporting body. By thinning the gallium nitride crystal layer and reducing the dislocations, it can be obtained the thin gallium nitride crystal layer of a low dislocation integrated with the supporting body, without peeling of it from the supporting body. In addition to this, it is possible to considerably reduce a time required for the crystal growth and to considerably improve the productivity, by thinning the gallium nitride crystal layer formed by flux method. As such thin film is formed, however, the in-plane distribution of the through dislocations tends to become large.

Thus, the present inventors have reached the idea of regularly arranging the protrusions each having a shape of a pyramid or a truncated pyramid on the surface of the gallium nitride seed crystal, and of directly and epitaxially growing the gallium nitride crystal layer thereon by flux method. It is thereby possible to decide the starting points of the crystal growth and to facilitate the association and disappearance of the defects efficiently. Therefore, it can be successfully obtained a composite substrate in which the defect density of the thus grown gallium nitride crystal layer (thin film having a thickness of 100 μm or smaller) grown by flux method is lowered and the in-plane distribution is reduced. The present invention was thus made.

According to the present invention, facet growth from the starting points of the growth is faster than that in a bottom part. The facet growth continues while it is associated with the dislocations from the bottom part and disappeared, so that grains of low defects can be efficiently enlarged.

EMBODIMENTS FOR CARRYING OUT THE INVENTION

The present invention will be described further in detail, referring to the attached drawings.

As shown in FIG. 1(a), protrusions 2 having a predetermined pattern are formed on a surface 1a of a supporting body 1 composed of a seed crystal. A flat face 3 is formed between the protrusions.

Then, as shown in FIG. 1(b), a gallium nitride crystal layer 4 is epitaxially grown by flux method on a growing face 1a of the seed crystal substrate 1. At this time, another buffer layer or intermediate layer is not interposed between the gallium nitride crystal layer 4 and the seed crystal 1. It is further made that the gallium nitride crystal layer 4 is not spontaneously peeled off from the seed crystal substrate 1. It is thus possible to reduce the dislocations and to obtain a composite substrate 20A having good crystallinity.

Since the thus obtained composite substrate 20A has a low dislocation density and reduced in-plane distribution of the dislocation density in the gallium nitride crystal layer, it can be used as a template for forming a functional layer 5 by vapor phase epitaxy process thereon (refer to FIG. 1(c)).

(Seed Crystal)

According to the present invention, the seed crystal is made of gallium nitride single crystal. The seed crystal may constitute a self-standing body (supporting body), or may be a seed crystal film formed on a separated supporting body. The seed crystal film may be composed of a single layer, or may further include a buffer layer on the side of the supporting body.

The seed crystal film may preferably be formed by vapor phase epitaxy process, including metal organic chemical vapor deposition (MOCVD), hydride vapor phase epitaxy (HVPE), pulse excited deposition (PXD), Molecular Beam Epitaxy (MBE) and sublimation processes. Metal organic chemical vapor deposition process is particularly preferable. Further, the growing temperature may preferably be 950 to 1200° C.

Single crystal referred to in the present specification is defined as follows. Although single crystal includes typical single crystals where atoms are regularly arranged throughout the whole of the crystal, "single crystal" is not limited to such typical ones and includes those generally referred to in the Industries. That is, single crystal may include a some degree of defects, or may include internal stress, or may contain impurities in the crystal structure, and includes those called single crystal which is distinguishable from polycrystals (ceramics).

(Supporting Body)

The supporting body is one on which the gallium nitride seed crystal can be grown.

Specifically, a single crystal substrate constituting the supporting body is not particularly limited. It includes sapphire, an AlN template, a GaN template, a GaN self-standing body, silicon single crystal, SIC single crystal, MgO single crystal, spinel ($MgAl_2O_4$), $LiAlO_2$, $LiGaO_2$, and perovskite composite oxides such as $LaAlO_3$, $LaGaO_3$ and $NdGaO_3$ and SCAM ($ScAlMgO_4$). Also, it is possible to use cubic perovskite structure composite oxides represented by the composition formula $[A_{1-y}(Sr_{1-x}Ba_x)_y][(Al_{1-z}Ga_z)_{1-u}D_u]O_3$ (where A is a rare-earth element, D is one or more elements selected from the group consisting of niobium and tantalum, y=0.3 to 0.98, x=0 to 1, z=0 to 1, u=0.15 to 0.49, and x+z=0.1 to 2).

In the case that the supporting body is of wurtzite-type structure, it includes c-face, a-face and m-face. Each of these crystalline faces is defined based on crystallography. The seed crystal film and gallium nitride crystal layer grown by flux method may be grown in a direction normal with respect to c-face, or each of normal line directions of a-face and m-face.

Figure 3:
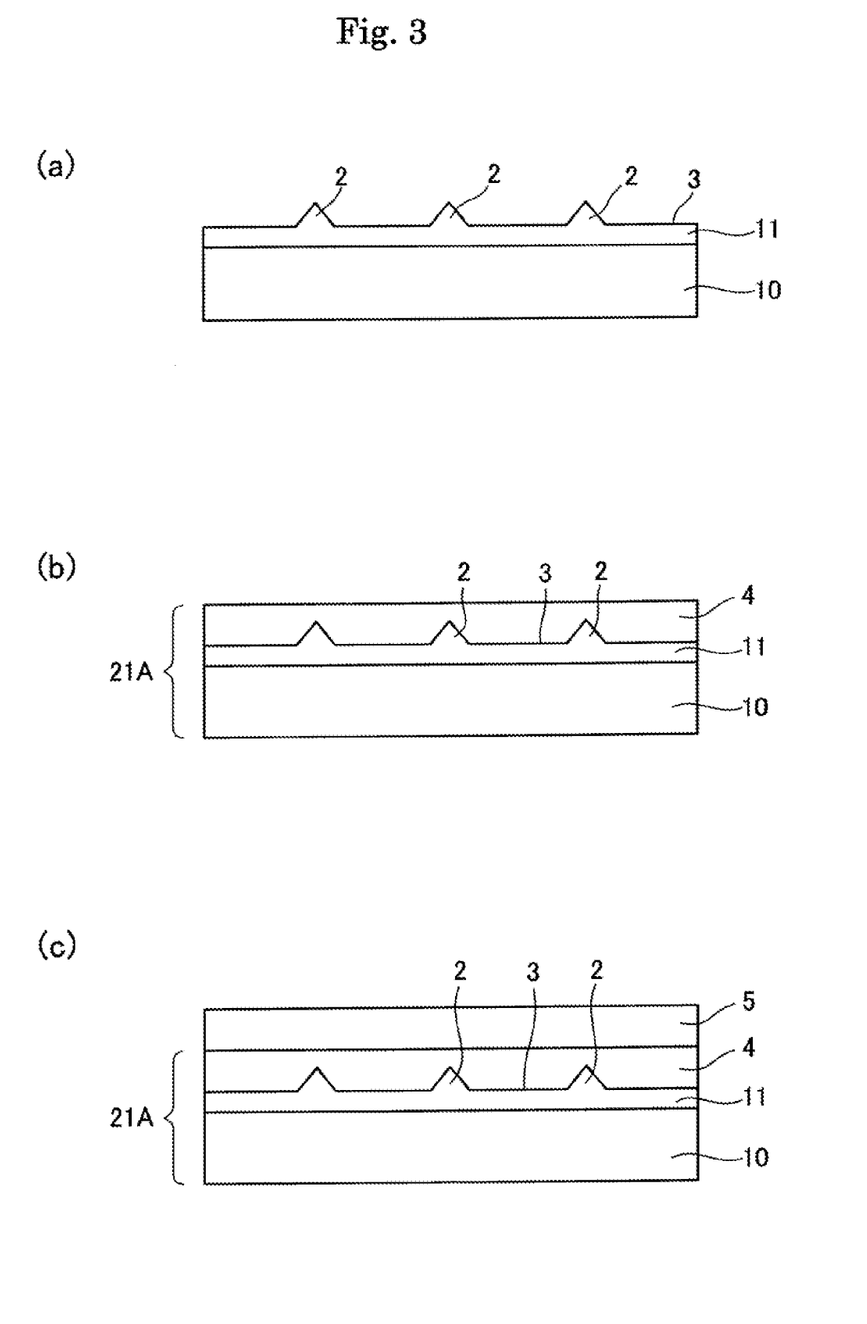
FIG. 3(a) is a schematic view showing a supporting body 10 and a seed crystal film 11.
FIG. 3(b) is a schematic view showing a composite substrate 21A including a gallium nitride crystal layer 4 formed on the seed crystal film 11.
FIG. 3(c) is a schematic view showing the state that a functional layer 5 is provided on the composite substrate 21A.

For example, as shown in FIG. 3(a), a seed crystal film 11 composed of gallium nitride single crystal is formed on a supporting body 10. Protrusions 2 having a predetermined pattern are formed on a surface of the seed crystal film 11. A flat face 3 is formed between the protrusions. The dislocations are reduced in the seed crystal film to obtain the seed crystal film of good crystallinity.

Then, as shown in FIG. 3(b), the gallium nitride crystal layer 4 is epitaxially grown by flux method on the surface of the seed crystal film 11. At this time, it is made that another buffer layer or an intermediate layer is not interposed between the gallium nitride crystal layer 4 and seed crystal film 11.

Further, it is made that the gallium nitride crystal layer 4 is not peeled off from the supporting body 10. It is thus possible to obtain a composite substrate 21A.

Since the thus obtained composite substrate 21A has a low dislocation density and reduced in-plane distribution of the dislocation density in the gallium nitride crystal layer, it can be used as a template for forming a functional layer 5 by vapor phase epitaxy process thereon (refer to FIG. 3(c)).

(Protrusions)

According to the present invention, protrusions each having a shape of a pyramid or a truncated pyramid are regularly arranged on the growing face of the seed crystal. The growing face means a face on which the gallium nitride crystal is epitaxially grown by flux method. Further, the phrase that protrusions are regularly arranged means that the protrusions are arranged at lease in one direction at a predetermined period, provided that the growing face is view in a plan view.

It is necessary that protrusion has a shape of a pyramid or a truncated pyramid. In the case that the protrusion has a shape of a column, the facet growth is not facilitated and the dislocation density of the gallium nitride crystal grown thereon becomes large. It is considered that the through dislocations are reduced by the epitaxial growth from side faces (inclined faces) of the pyramid-shaped protrusions. In the case of the column-shaped protrusions, since the side face is not inclined, the above effects would be considered to be weak. Further, in the case that the protrusion has a shape of a strip, it tends to be generated the in-plane distribution of the through dislocations along the shape of the strip.

The protrusion has a shape of a pyramid or a truncated pyramid. The pyramid includes a cone or a polygonal pyramid such as a triangular pyramid, quadrangular pyramid, hexagonal pyramid or the like. The truncated pyramid includes a truncated cone, or a truncated polygonal pyramid such as a truncated triangular pyramid, truncated quadrangular pyramid, truncated hexagonal pyramid or the like. Since the seed crystal film has wurtzite structure, the protrusion may most preferably has a shape of a hexagonal pyramid on the viewpoint of epitaxial growth. Further, it may have a shape of a triangular pyramid on the viewpoint that it may be converted to a hexagonal shape during the crystal growth.

Besides, a normal line to an upper face of the truncated pyramid may be parallel with a normal line to a bottom face of the truncated pyramid. Alternatively, the normal line to the upper face of the truncated pyramid may be inclined with respect to with the normal line to the bottom face. In the case that the normal line to the upper face is inclined with respect to the normal line to the bottom face, the angle of inclination may preferably be 62° or smaller and more preferably be 60° or smaller. In the case that the normal line is inclined, the surface orientation of the upper face of the truncated pyramid may be different from that of the bottom face.

Figure 2:
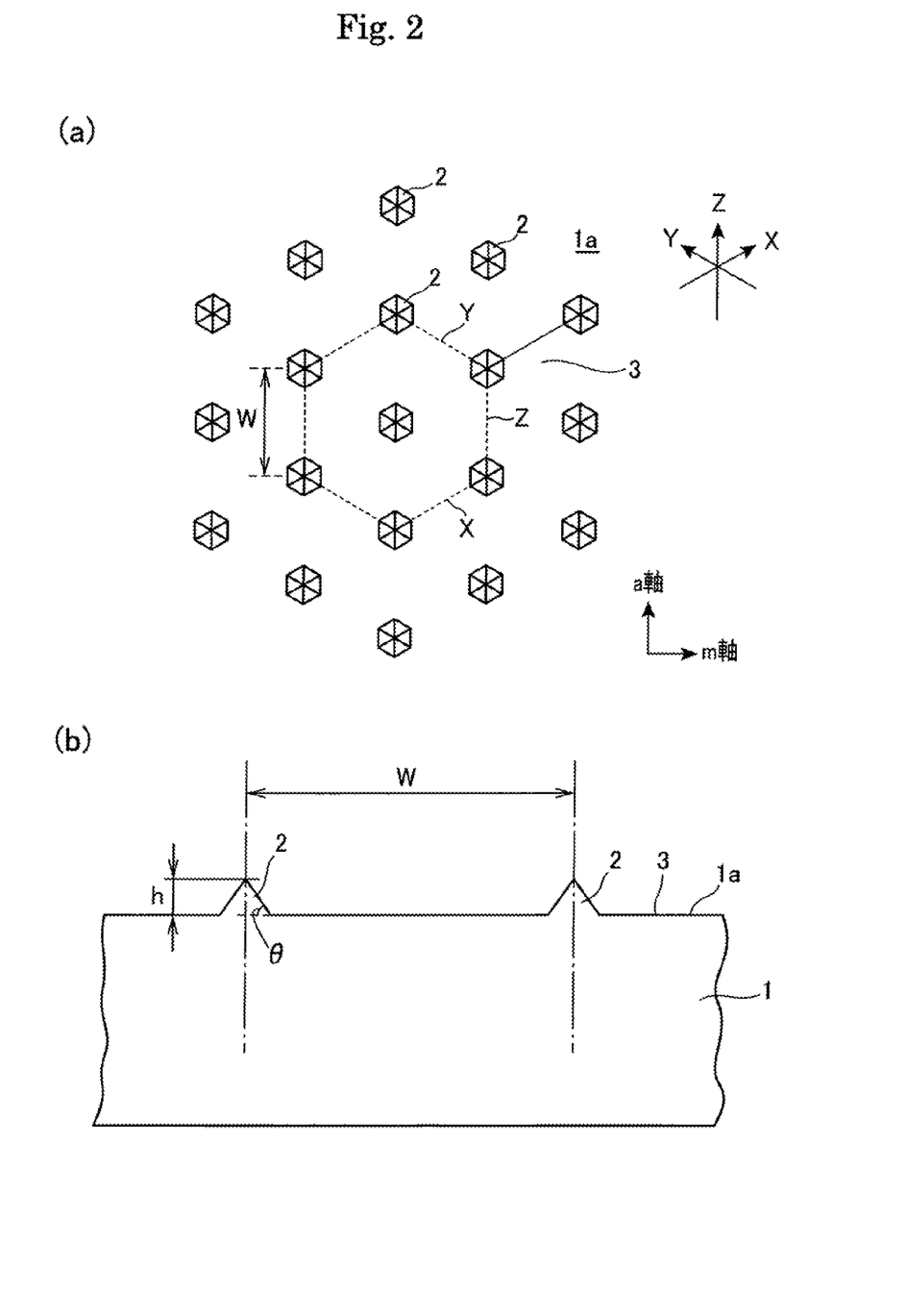
FIG. 2(a) is a view showing a pattern of protrusions 2 on a seed crystal.
FIG. 2(b) shows the shape of the protrusion.

For example, according to the example shown in FIG. 2, many protrusions 2 are arranged on the gorwing face 1a of the seed crystal 1, and a flat face 3 is formed between the protrusions 2. The protrusion has a shape of a hexagonal pyramid. The protrusions 2 are arranged in the direction of a-axis (Z direction), which is the direction of a normal line to m axis, at a predetermined period, and further arranged in X direction intersecting the Z direction at a predetermined period.

Here, the a-axis means <1 1 -2 0> of hexagonal single crystal. As gallium nitride is of hexagonal system, a1, a2 and a3 are equivalent, and six axes of [2 -1 -1 0], [1 1 -2 0], [-1 2 -1 0], [-2 1 1 0], [-1 -1 2 0] and [1 -2 1 0] are equivalent. Among the six, a-axis is commonly represented by [1 1 -2 0], and a-axis referred to in the specification means the above equivalent axes, so that the representation of [1 1 -2 0] includes all the above equivalent representations of the axes.

Figure 4:
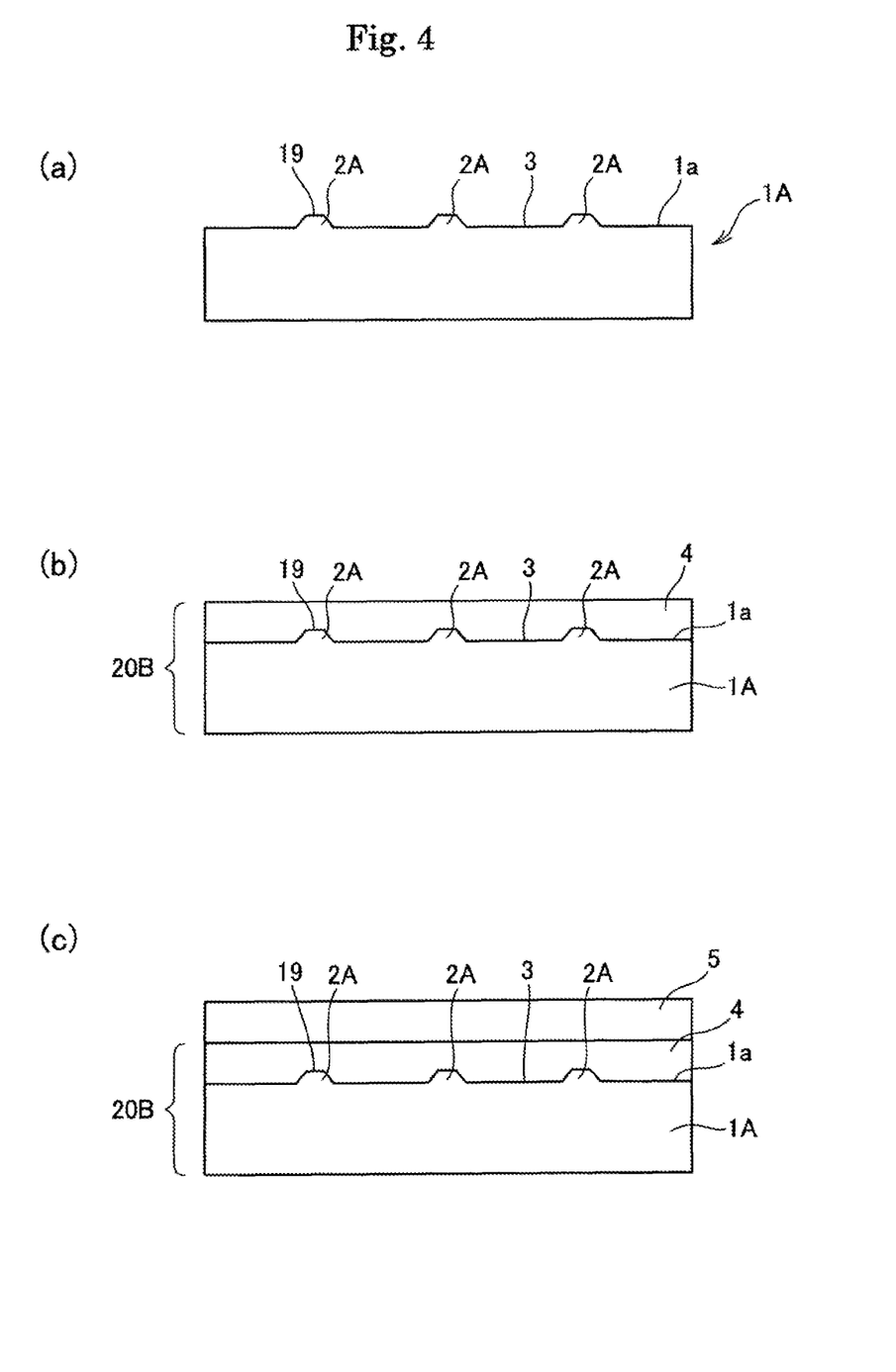
FIG. 4(a) is a schematic view showing a seed crystal substrate 1A.
FIG. 4(b) is a schematic view showing a composite substrate 20B including a gallium nitride crystal layer 4 provided on the seed crystal substrate 1A.
FIG. 4(c) is a schematic view showing a functional layer 5 provided on the composite substrate 20B.
Figure 5:
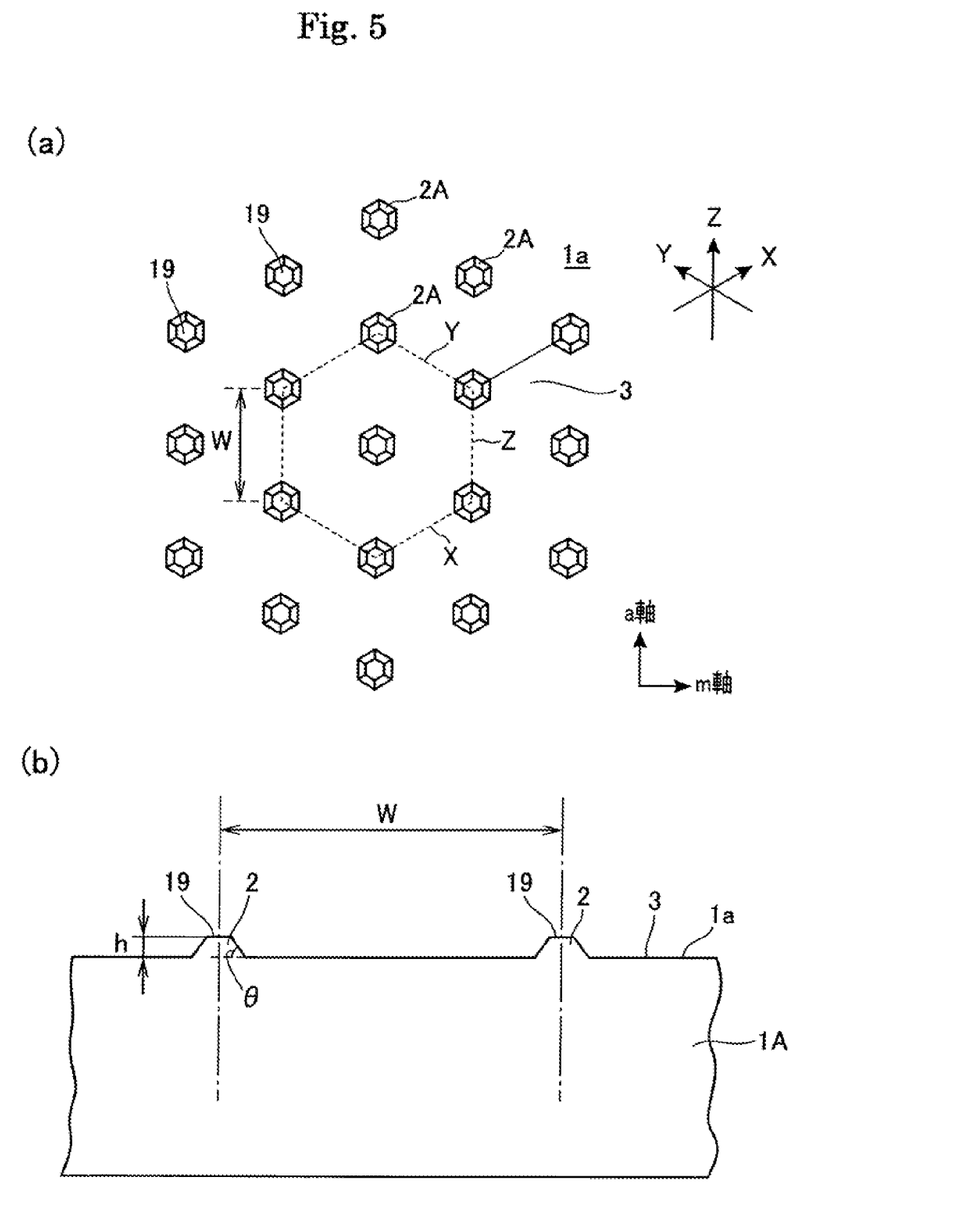
FIG. 5(a) shows an example of a pattern of protrusions 2A on a seed crystal.
FIG. 5(b) shows the shape of the protrusion.

Further, according to another example, as shown in FIGS. 4 and 5, many protrusions 2A are arranged on the growing face 1a of the seed crystal 1, and the flat face 3 is formed between the protrusions 2A. The protrusion 2A has a shape of a truncated hexagonal pyramid. The protrusions 2A are arranged in the direction of a-axis (Z direction) at a predetermined period, and further arranged in the X direction intersecting the Z direction at a predetermined period.

As shown in FIG. 4(a), protrusions 2A having a predetermined pattern are formed on the surface 1a of a supporting body 1A of a seed crystal. A flat face 3 is formed between the protrusions. Then, as shown in FIG. 4(b), the gallium nitride crystal layer 4 is epitaxially grown by flux method on the surface of the seed crystal substrate 1A. At this time, it is made that another buffer layer or an intermediate layer is not interposed between the gallium nitride crystal layer 4 and seed crystal 1A. Further, it is made that the gallium, nitride crystal layer 4 is not peeled off from the seed crystal substrate 1A. It is thus possible to obtain the composite substrate 20B.

Since the thus obtained composite substrate 20B has a low dislocation density and reduced in-plane distribution of the dislocation density in the gallium nitride crystal layer, it can be used as a template for forming a functional layer 5 by vapor phase epitaxy process thereon (refer to FIG. 4(c)).

In the case that the protrusion has a shape of a hexagonal pyramid or a truncated hexagonal pyramid, preferably, the X axis and Z axis (a-axis) are intersected at an angle "α" of 25 to 75° (refer to FIGS. 2(a) and 5(a)). "α" may more preferably be 30° or larger. Further, preferably, six of the protrusions formed a hexagonal lattice surrounding one protrusion. More preferably, the top points of the hexagonal shapes of the adjacent protrusions oppose each other (parallel with the m-axis).

The height "h" of the protrusion with respect to the flat face 3 may preferably be 0.2 μm or larger and more preferably be 0.5 μm or larger, on the viewpoint of reducing the dislocations and its in-plane distribution of the gallium nitride crystal layer grown by flux method. Further, on the similar viewpoint, it may preferably be 10 μm or smaller and more preferably be 5 μm or smaller.

Further, the period "W" of arrangement of the protrusions may preferably be 2 μm or larger and more preferably be 5 μm or larger, on the viewpoint of reducing the dislocations and its in-plane distribution of the gallium nitride crystal layer grown by flux method. On the similar point of view, it may preferably be 75 μm or smaller and more preferably be 50 μm or smaller.

The inclined angle "θ" of a rising part of the protrusion from the flat face may preferably be 30 to 70° and more preferably be 35 to 62°, on the viewpoint of the present invention.

In the case that the protrusion has a shape of a truncated pyramid, a flat face 19 is formed on the upper side of the protrusion (refer to FIG. 5). On the viewpoint of the present invention, the ratio of an area of the upper flat face 19 of the protrusion with respect to an area of the bottom face of the protrusion may preferably be 15 to 95 percent and more preferably be 30 to 80 percent.

Besides, as described above, the normal line to the upper face of the truncated pyramid may be parallel with the normal line to the bottom face, or the normal line to the upper face may be inclined with respect to the normal line to the bottom face.

Further, in the case that the protrusion has a shape of a pyramid, it is not necessary that the upper end of the protrusion is sharpened in strict meaning in geometry, and the upper end may be rounded due to the processing precision or R-processing, C-processing or chamfering may be performed at the top end of the pyramid-shaped protrusion.

Preferably, the protrusions are arranged in at least two directions. Here, it is sufficient that the two directions intersect each other and it is not necessary that the two directions are crossed at the right angle. However, the intersecting angle of the two directions may preferably be 45 to 75° and more preferably be 55 to 65°.

In the case that the protrusions are arranged in at lease two directions, it is preferred that the period (pitch) of arrangement of the protrusions is constant in each of the respective directions.

Based on these preferred conditions of the protrusions, the area of the flat face except the protrusions may preferably occupy 80 to 99.99 percent of a wafer.

(Gallium Nitride Crystal Layer)

The composite substrate of the present invention includes the gallium nitride crystal layer having a thickness of 100 μm or smaller and directly formed on the growing face of the seed crystal by flux method.

The gallium nitride crystal layer is made a thin film of 100 μm or smaller. It is thereby possible to prevent the peeling of the gallium nitride crystal layer from the substrate. However, as the gallium nitride crystal layer is made thinner, the dislocations extending through the gallium nitride crystal layer tend to be increased, and the present invention is particularly effective.

The thickness of the gallium nitride crystal layer 4 may preferably be 3 μm or larger and more preferably be 5 μm or larger, on the viewpoint of crystal quality with respect to the dislocation density.

According to the present step, the gallium nitride crystal layer is grown by flux method. On this occasion, as long as the gallium nitride crystal can be generated, a type of the flux is not particularly limited. In a preferred embodiment, the flux containing at least one of an alkaline metal and an alkaline-earth metal is used, and the flux containing sodium metal may be particularly preferably used.

As to the flux, a gallium raw material is mixed and used. As such gallium raw material, for example, gallium single metal, a gallium alloy or a gallium compound may be used. In terms of handling, gallium single metal may be used preferably.

The growth temperature of the gallium nitride crystal in the flux method and the holding time during the growth are not particularly limited, and they are appropriately changed in accordance with a composition of the flux. As an example, when the gallium nitride crystal is grown using a flux containing sodium or lithium, the growth temperature may be preferably set to 800° C. to 950° C., and more preferably set to 800 to 900° C.

By flux method, a single crystal is grown in an atmosphere of nitrogen-containing gas. For this gas, nitrogen gas may be preferably used, and ammonia may be used. The total pressure of the atmosphere is not particularly limited; but it may be preferably set to 10 atm or more, and further preferably 30 atm or more, from the standpoint of prevention against the evaporation of the flux. However, as the pressure is high, an apparatus becomes large. Therefore, the total pressure of the atmosphere may be preferably set to 2000 atm or less, and further preferably 500 atm or less. Any other gas except the nitrogen-containing gas in the atmosphere is not limited; but an inert gas may be preferably used, and argon, helium, or neon may be particularly preferably used.

(Functional Layer)

A functional layer is formed on the thus obtained composite substrate by vapor phase epitaxy method.

Such functional layer may be composed of a single layer or a plurality of layers. Further as the function, it may be used for a white LED with improved color rendering index, a blue-violet laser for high-speed and high-density optical memory, and a power device for an inverter for a hybrid car or the like.

For example, according to FIG. 1(c), FIG. 3(c) and FIG. 4(c), a functional layer 5 is formed on the composite substrate. Here, the functional layer may be composed of a plurality of layers.

For example, the light emitting device includes a n-type semiconductor layer, a light emitting region provided on the n-type semiconductor layer and a p-type semiconductor layer provided on the light emitting region. It is thereby possible to obtain a light emitting layer having a low dislocation density, so that the internal quantum efficiency of the light emitting device is improved.

Figure 6:
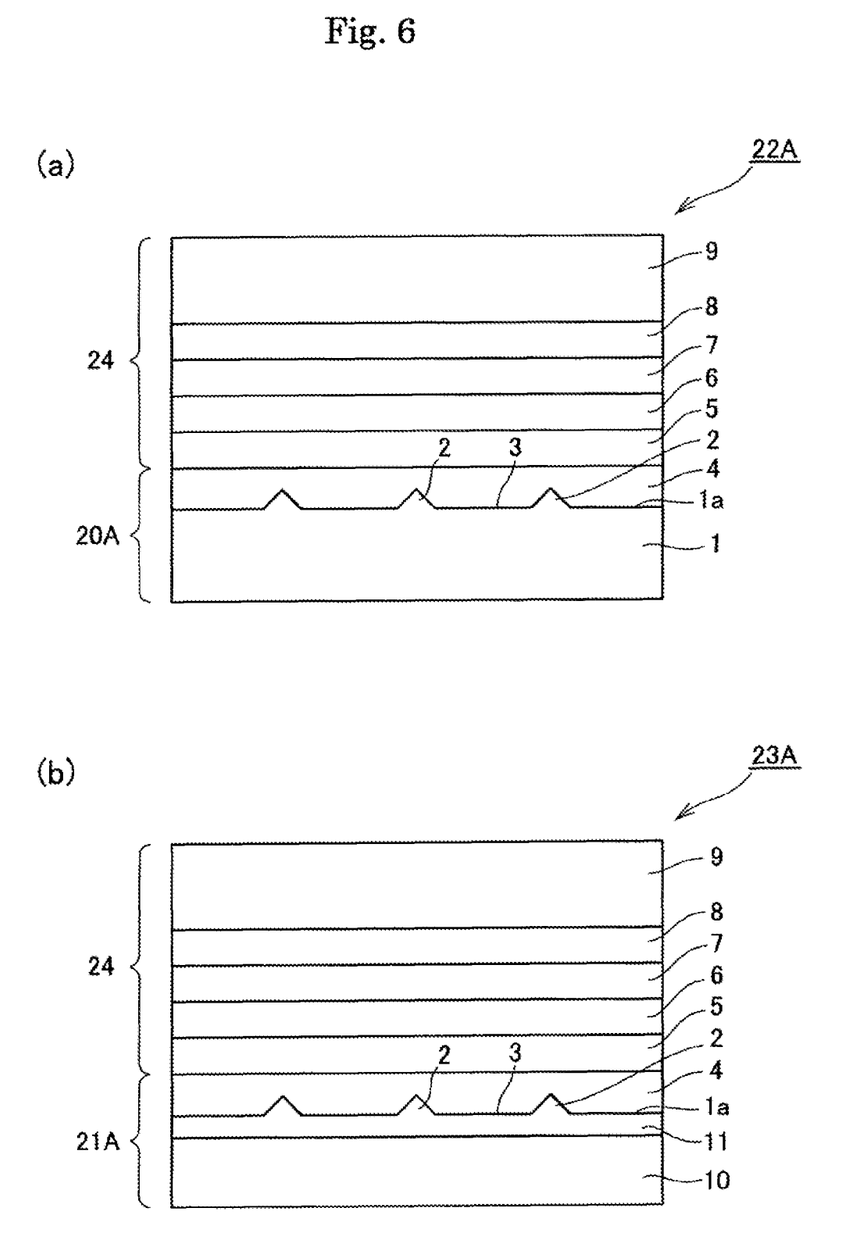
FIG. 6(a) is a schematic view showing a light emitting device 22A including a semiconductor light emitting structure 24 provided on the composite substrate 20A.
FIG. 6(b) is a schematic view showing the light emitting device 23A including a semiconductor light emitting structure 24 provided on the composite substrate 21A
Figure 7:
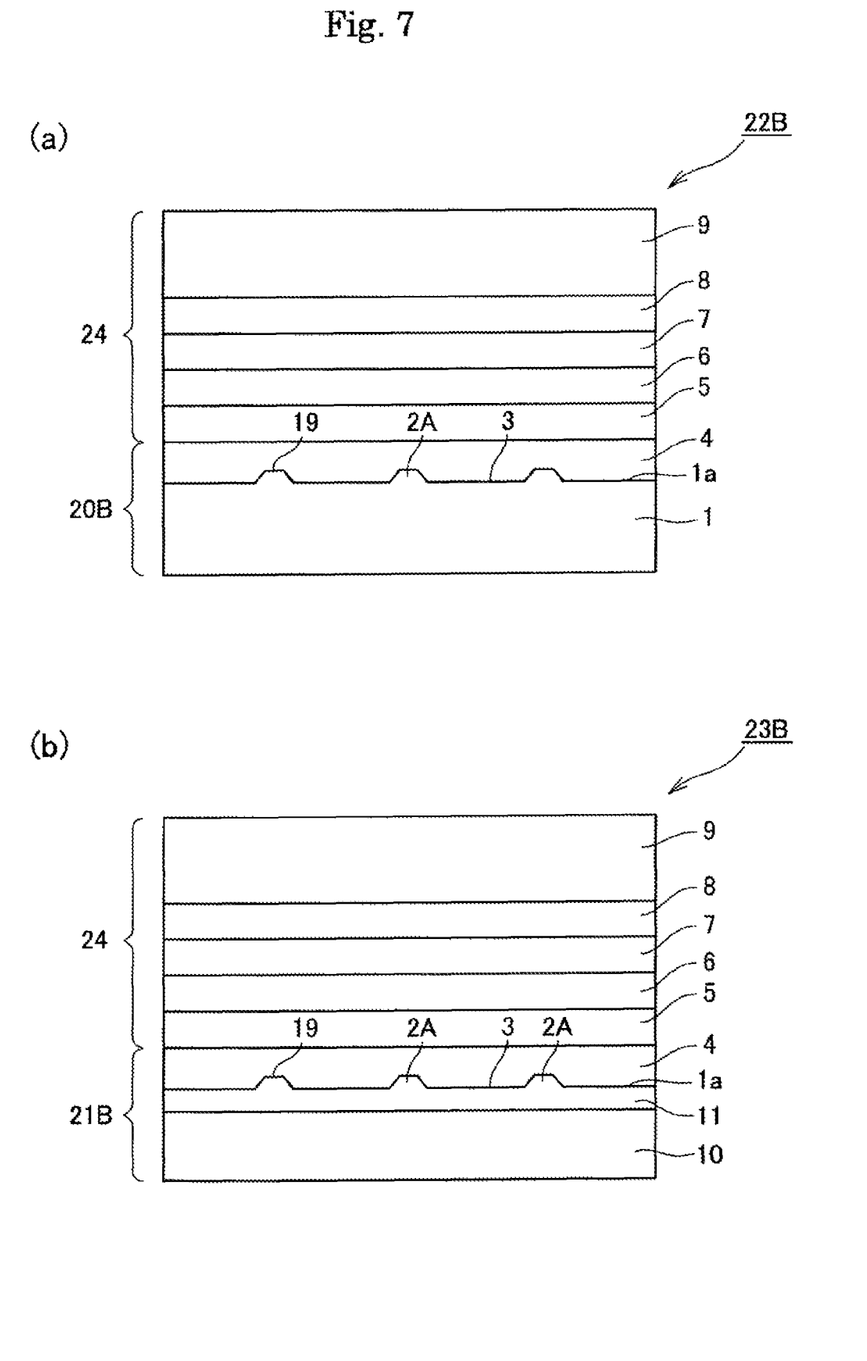
FIG. 7(a) is a schematic view showing a light emitting device 22B including the semiconductor light emitting structure 24 provided on the composite substrate 20B.
FIG. 7(b) is a schematic view showing a light emitting device 23B including the semiconductor light emitting structure 24 provided on the composite substrate 21B.

According to a light emitting device 22A shown in FIG. 6(a), a n-type contact layer 5, a n-type clad layer 6, an active layer 7, a p-type clad layer 8 and a p-type contact layer 9 are formed on the gallium nitride crystal layer 4 to constitute a light emitting device structure 24. According to a light emitting device 23A shown in FIG. 6(b), the light emitting device structure 24 is formed on the gallium nitride crystal layer 4 of the composite substrate 21A. According to a light emitting device 22B shown in FIG. 7(a), the light emitting device structure 24 is formed on the gallium nitride crystal layer 4 of the composite substrate 20B. According to a light emitting device 23B shown in FIG. 7(b), the light emitting device structure 24 is formed on the gallium nitride crystal layer 4 of the composite substrate 21B.

As a semiconductor light emitting diode (LED) is produced on the composite substrate by a vapor phase epitaxy process, preferably by metal organic vapor phase deposition (MOCVD), the dislocation density inside of the LED can be made comparable with that of the GaN template.

The film-forming temperature of the functional layer may preferably be 700° C. or higher and more prefer be 750° C. or higher, on the viewpoint of quality of the functional layer. Further, the film-forming temperature of the functional layer may preferably be 1200° C. or lower and more preferably be 1100° C. or lower, on the viewpoint of preventing cracks and fractures in the gallium nitride crystal.

The material of the functional layer may preferably be a nitride of a group 13 element. Group 13 element means group 13 element according to the Periodic Table determined by IUPAC. The group 13 element is specifically gallium, aluminum, indium, thallium or the like. Further, as an additive, it may be listed carbon, a metal having a low melting point (tin, bismuth, silver, gold), and a metal having a high melting point (a transition metal such as iron, manganese, titanium, chromium). The metal having a low melting point may be added for preventing oxidation of sodium, and the metal having a high melting point may be incorporated from a container for containing a crucible, a heater of a growing furnace or the like.

(Applications)

The present invention may be used in technical fields requiring high quality, such as a white LED with improved color rendering index and expected as a post-fluorescent lamp, a blue-violet laser disk for high-speed and high-density optical memory, and a power device for an inverter for a hybrid car or the like.

EXAMPLES

Example 1

Figure 1:
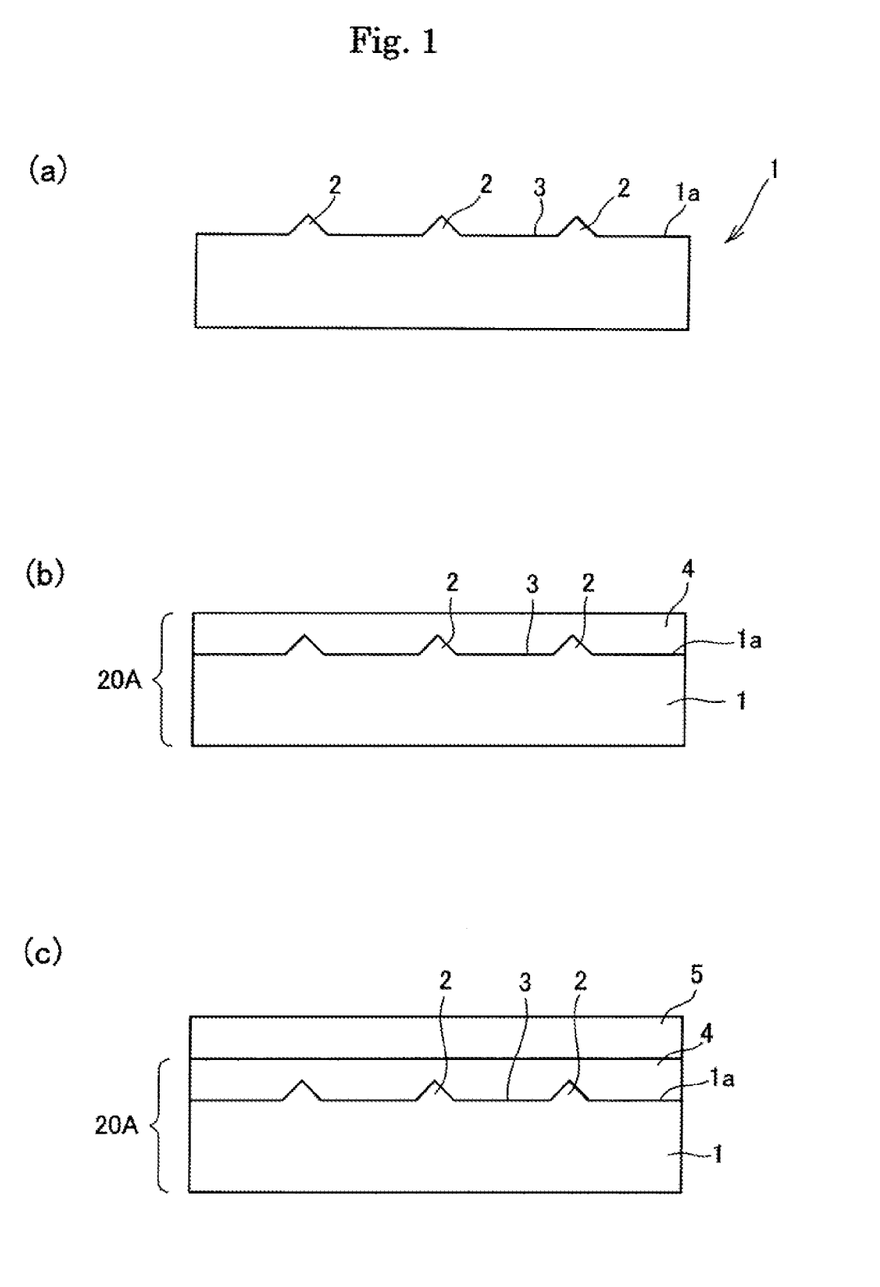
FIG. 1(a) is a schematic view showing a seed crystal substrate 1.
FIG. 1(b) is a schematic view showing a composite substrate 20A including a gallium nitride crystal layer 2 formed on the seed crystal substrate 1.
FIG. 1(c) is a schematic view showing the state that a functional layer 5 is provided on the composite substrate 20A.

The composite substrate 20A was produced as shown in FIGS. 1 and 2.

Specifically, it was prepared a self-standing substrate 1 composed of gallium nitride seed crystal whose in-plane distribution of dislocation density by CL was $2 \times 10^8/cm^2$ in average excluding an outer periphery with a width of 1 cm. It was provided, on the seed crystal substrate 1, a mask of $SiO_2$ patterned with photolithography, and protrusions 2 each having a shape of a hexagonal pyramid were formed on the Ga face by ME. The protrusion 2 had a height of 1 μm and a width of 2 μm. The protrusions 2 were arranged according to hexagonal pattern and in parallel with a-axis at a period of 50 μm. Further, the a-axis (Z direction) and the X direction intersected with each other at an angle of 60°.

The seed crystal substrate 1 with the protrusions 2 was used to form the gallium nitride crystal layer 4 by flux method. Na and Ga were contained in a crucible and held at 850° C. and 4.0 MPa (nitrogen atmosphere) for 20 hours to grow the crystal layer 4. Na:Ga was made 40 g:30 g. After the reaction, it was cooled to room temperature, and the flux was removed by the chemical reaction with ethanol to obtain the colorless and transparent crystal 4 having a grown thickness of 90 μm. Voids were not generated on the surface of the crystal. It was then polished and it was measured the in-plane distribution of dislocation density by CL to prove to be 7 to $9 \times 10^5/cm^2$ in average.

Example 2

The composite substrate was produced according to the same procedure as the Example 1. However, the period of arrangement of the protrusions 2 formed on the seed crystal substrate 1 in the direction of a-axis was made 10 μm. It was thus obtained the colorless and transparent crystal 4 having a grown thickness of 90 μm. Voids were not generated on the surface of the crystal. It was then polished and it was measured the in-plane distribution of dislocation density by CL to prove to be 3 to $4 \times 10^5/cm^2$ in average.

Example 3

The composite substrate was produced according to the same procedure as the Example 1. However, the period of arrangement of the protrusions 2 formed on the seed crystal substrate 1 in the direction of a-axis was made 30 μm. It was thus obtained the colorless and transparent crystal 4 having a grown thickness of 85 μm. Voids were not generated on the surface of the crystal. It was then polished and it was measured the in-plane distribution of dislocation density by CL to prove to be 7 to $9 \times 10^5/cm^2$ in average.

Example 4

The composite substrate was produced according to the same procedure as the Example 1. However, the height and width of the protrusion 2 formed on the seed crystal substrate 1 were made 3 μm and 8 μm, respectively. It was thus obtained the colorless and transparent crystal 4 having a grown thickness of 95 μm. Voids were not generated on the surface of the crystal. It was then polished and it was measured the in-plane distribution of dislocation density by CL to prove to be 6 to $8 \times 10^5/cm^2$ in average.

Example 5

The composite substrate was produced according to the same procedure as the Example 1. However, the protrusion 2 formed on the seed substrate 1 had a shape of a truncated hexagonal pyramid. The truncated hexagonal pyramid had a height of 1 μm, a width at the head of 1.5 μm and a width at the bottom of 3.0 μm, respectively, and the period was made 50 μm in the direction of a-axis. As a result, it was obtained the colorless and transparent crystal 4 having a grown thickness of 80 μm. Voids were not generated on the surface of the crystal. It was then polished and it was measured the in-plane distribution of dislocation density by CL to prove to be 8 to $9 \times 10^5/cm^2$ in average.

Comparative Example 1

The composite substrate was produced according to the same procedure as the Example 1. However, the protrusions 2 were not formed on the seed crystal substrate 1 so that the growing face of the substrate was made flat. As a result, it was obtained the colorless and transparent crystal 4 having a grown thickness of 92 μm. Voids were not generated on the surface of the crystal. It was then polished and it was measured the in-plane distribution of dislocation density by CL to prove to be $2 \times 10^5/cm^2$ to $5 \times 10^7/cm^2$ in average.

Comparative Example 2

The composite substrate was produced according to the same procedure as the Example 1. However, the protrusions 2 were not formed on the seed crystal substrate 1. Instead, the self-standing substrate of gallium nitride was immersed in mixture of phosphoric acid and sulfuric acid heated at 250° C. for about 2 hours to perform the wet etching so that random roughness was formed onto the growing face.

As a result, it was obtained the colorless and transparent crystal 4 having a grown thickness of 78 μm, although inclusions were included therein. The surface was then polished so as to leave the grown crystal, and there was left parts which were not filled with the grown crystal. The reason is considered as follows. That is, it was generated pits having especially large openings, such as those having a width of 300 microns or more, on the growing face due to the wet etching, and the upper parts in the grown crystal over the pits were recessed compared to the other parts so that the recessed parts were not filled. It was measured the in-plane distribution of dislocation density by CL to prove to be $7 \times 10^6/cm^2$ to $9 \times 10^6/cm^2$ in average.

Comparative Example 3

The composite substrate was produced according to the same procedure as the Example 1. However, the protrusions 2 were not formed on the seed crystal substrate 1. Instead, the self-standing substrate of gallium nitride eras subjected to photolithography using an $SiO_2$ mask pattern to form stripe-shaped grooves at a period of arrangement of 700 μm with non-growth parts each having a width of 500 μm.

As a result, it was obtained the colorless and transparent crystal 4 having a grown thickness of 92 μm. However, although over growth of the crystal started laterally from the seed crystal parts adjacent to the stripe-shaped grooves, the crystal could not fill the grooves. After the polishing, it was measured the in-plane distribution of dislocation density by CL to prove to be $6 \times 10^6/cm^2$ to $8 \times 10^6/cm^2$ in average.

Example 6

The composite substrate was produced according to the same procedure as the Example 1. However, the height and width of the protrusion 2 formed on the seed crystal substrate 1 were made 7 μm and 18 μm, respectively, and the protrusions were arranged at a period of 50 μm in the direction of the a-axis. As a result, it was obtained the colorless and transparent crystal 4 having a grown thickness of 110 μm Although micro inclusions were included inside of the crystal, it was proved to be $9 \times 10^5/cm^2$ to $1 \times 10^6/cm^2$ in average after the polishing.

Example 7

The composite substrate was produced according to the same procedure as the Example 1. However, the protrusion 2 formed on the seed substrate 1 were arranged at a period of 200 μm in the direction of the a-axis. As a result, it was obtained the colorless and transparent crystal 4 having a grown thickness of 90 μm. After the polishing, it was measured the in-plane distribution of dislocation density by CL to prove to be $5 \times 10^6/cm^2$ to $2 \times 10^6/cm^2$ in average.

Example 8

The composite substrate was produced according to the same procedure as the Example 1. However, the protrusion 2 formed on the seed crystal substrate 1 had a shape of a truncated hexagonal pyramid. The hexagonal pyramid bad a height of 1 μm, a width at the head of 27 μm and a width at the bottom of 29 μm, respectively, and the period was made 50 μm in the direction of a-axis. As a result, it was obtained the colorless and transparent crystal 4 having a grown thickness of 80 μm. It was then polished and it was measured the in-plane distribution of dislocation density by CL to prove to be $8 \times 10^5$ to $9 \times 10^6/cm^2$ in average.

The invention claimed is:

1. A composite substrate comprising:
    a seed crystal comprising gallium nitride single crystal and protrusions arranged regularly on a growing face of said seed crystal, said protrusions each having a shape of a pyramid or a truncated pyramid; and
    a gallium nitride crystal layer formed directly on said growing face of said seed crystal and having a thickness of 110 μm or smaller,
    wherein said protrusion has a height of 10 μm or smaller and said protrusions are regularly arranged at a period of arrangement of 2 to 75 μm.

2. The composite substrate of claim 1, wherein said protrusions are arranged at a constant period at least in a direction of a normal line to m-axis of said seed crystal, provided that said growing face is viewed in a plan view.

3. The composite substrate of claim 1, wherein said protrusion has a shape of a hexagonal pyramid or a truncated hexagonal pyramid.

4. The composite substrate of claim 1, wherein said protrusions are regularly arranged at least in two directions, provided that said growing face is viewed in a plan view.

5. The composite substrate of claim 1, wherein said seed crystal comprises a supporting body.

6. The composite substrate of claim 1, further comprising a supporting body, wherein said seed crystal comprises a seed crystal film provided on said supporting body.

7. The composite substrate of claim 1, wherein said protrusion has a shape of a truncated pyramid, and wherein a ratio of an area of an upper flat face of said protrusion with respect to an area of a bottom face of said protrusion is 15 to 95 percent.

8. The composite substrate of claim 1, wherein said gallium nitride crystal layer has a thickness of 100 μm or smaller.

9. A functional device comprising said composite substrate of claim 1 and a functional layer formed on said gallium nitride crystal layer by vapor phase epitaxy process and comprising a nitride of a group 13 element.

10. The functional device of claim 9, wherein said functional layer comprises a light emitting device.

11. A composite substrate comprising:
    a seed crystal comprising gallium nitride single crystal and protrusions arranged regularly on a growing face of said seed crystal, said protrusions each having a shape of a pyramid or a truncated pyramid; and
    a gallium nitride crystal layer formed directly on said growing face of said seed crystal and having a thickness of 110 μm or smaller,
    wherein said protrusion has a height of 10 μm or smaller and said protrusions are regularly arranged at a period of arrangement of 2 to 75 μm,
    said protrusions are arranged at a constant period at least in a direction of a normal line to m-axis of said seed crystal, provided that said growing face is viewed in a plan view,
    said protrusion has a shape of a hexagonal pyramid or a truncated hexagonal pyramid, and
    said protrusions are regularly arranged at least in two directions, provided that said growing face is viewed in a plan view.

* * * * *